(12) United States Patent
Condon et al.

(10) Patent No.: US 7,964,158 B1
(45) Date of Patent: Jun. 21, 2011

(54) METHOD AND APPARATUS FOR GROWING POTASSIUM LEAD CHLORIDE CRYSTALS

(75) Inventors: Nicholas J. Condon, Greenbelt, MD (US); Steven R. Bowman, Edgewater, MD (US); Shawn P. O'Connor, Arlington, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 704 days.

(21) Appl. No.: 11/747,564

(22) Filed: May 11, 2007

Related U.S. Application Data

(60) Provisional application No. 60/747,128, filed on May 12, 2006.

(51) Int. Cl.
*B01D 9/00* (2006.01)
(52) U.S. Cl. ............... 422/243; 422/245.1; 117/200
(58) Field of Classification Search ............. 422/243, 422/245.1; 117/200
See application file for complete search history.

(56) References Cited

U.S. PATENT DOCUMENTS 3,929,556 A * 12/1975 Pandey .................. 117/109
4,946,543 A * 8/1990 Kalisher et al. ............ 117/106

OTHER PUBLICATIONS

Nostram, M. C., "Optical Properties of Dy3t -andNd3t -doped Bpb2Cl5," J. Opt. Soc. Am. B, vol. 18, No. 3,pp. 264-276, Mar. 2001.

Nostrand, M. C., "Laser demonstration of rare-earth ions in low-phonon chloride and sulfide crystals," Advanced Solid State Lasers, H. Injeyan, U, Keller, and C, Marshal, eds., vol. 34 of OSA Trends in Optics and Photonics series (Optical Society of America, 2000), pp. 459-463.

Nostrand, M. C., "Room temperature CaGa2S4:Dy3t laser action at 2.43 um and 4.31 um and Kpb2Cl5 laser action at 2.43 um", Advanced Solid-state Lasers, M. M. Fejer, H. Injeyan, and U. Keller, eds., vol. 26 of OSA Trends in Optics and Photonics Series (Optical society of America, 1999), pp. 441-449.

Nitsch, K., "Ternary alkali lead chlorides-crystal-growth, crystal-structure, absorption and emission properties", Prog. Cryst. Growth Charact. 30, pp. 1-22, 1995.

Nitsch, K., "The purification and preparation of high-purity PbCl2 and ternary alkali lead chloride single crystals", J. Cryst. Growth, vol. 131, No. 3-4, pp. 612-615, 1993.

Jenkins, N. W., "Spectroscopic characterization so Er-doped Kpb2Cl5 laser crystals", Opt. Mater. 22, pp. 311-320, 2003.

(Continued)

*Primary Examiner* — Matthew J Song
(74) *Attorney, Agent, or Firm* — Amy Ressing; Suresh Koshy

(57) ABSTRACT

A method and apparatus for growing a single crystal $KPb_2Cl_5$ material using a device including a plug including an axis. The plug includes a first portion defining a cylindrical hole about the axis. The plug includes a second portion defining a first conical hole about the axis. The first conical hole has a first angle. The plug includes a third portion defining a second conical hole about the axis. The second conical hole has a second angle opposite in sign relative to the first angle. The plug includes a fourth portion defining a third conical hole about the axis. The third conical hole has a third angle, the third angle having a same sign as the second angle and being greater than the second angle. The device further includes an ampoule including the plug fused therein.

5 Claims, 3 Drawing Sheets

OTHER PUBLICATIONS

Isaenko, L., "New low-phonon frequency crystals bases on rare-earth-doped double halgenides for multiwavelength diode-pumped solid state laser", in Seventh Inernational Symposium on Laser Metrology applied to Science, Industry, and Everyday Life, Y.V. Chugui,S, N. Bagayev, A. Weckenmann, and P. H. Osanna, eds., Proc. SPIE 4900, pp. 962-972, 202, 2002.

Isaenko, L., "New laser crystal based on KPb2C15 for IR region", Mater. Sci. Eng. B 81, pp. 188-190, 2001.

Bowman, S. R., "Growth and characterization of direct mid-IR laser materials", Proceedings—SPIE The International Society for Optical Engineering, vol. 5707, pp. 135-140, 2005.

Bowman, S. R., "New mid-IR laser based on an erbium activated low phonon energy crystal", Conference on Lasers and Electro-Optics, vol. 56 of 2001 OSA Technical Digest Series (Optical Society of America, Washington, D. C., 2001), pp. 557-558.

Bowman. S. R., "Further Investigations of potential 4-micron laser materials", OSA Trends in Optics and Photonics vol. 26, Advanced Solid State Lasers, Martin M. Fejer, Hagop Injeyan. Ursula Keller eds. (Optical Society of America, Washington. DC 1999) pp. 487-491.

Boeman, S. R., "A 7-um Praseodymium-Based Solid-State Laser" J. Quantum electron., vol. 32, issue 4, p. 646.

Balda, R., "Viable Luminescence in KPb2C15:Pr3t Crystal", Journal of Luminescence, vol. 97, pp. 190-197, 2002.

Voda, M., "Crystal growth or rare-earth-doped ternary potassium lead chloride single crystals by the Bridgman method", Optical Materials, v. 26, iss. 4 [Special Issue], p. 359-363, Sep. 2004.

Jenkens, N. W., "Spectroscopic analysis and laser modeling ofneodymium-doped potassium lead chloride" J. Luminescence, vol. 97, No. 2, pp. 127-134 2002.

* cited by examiner

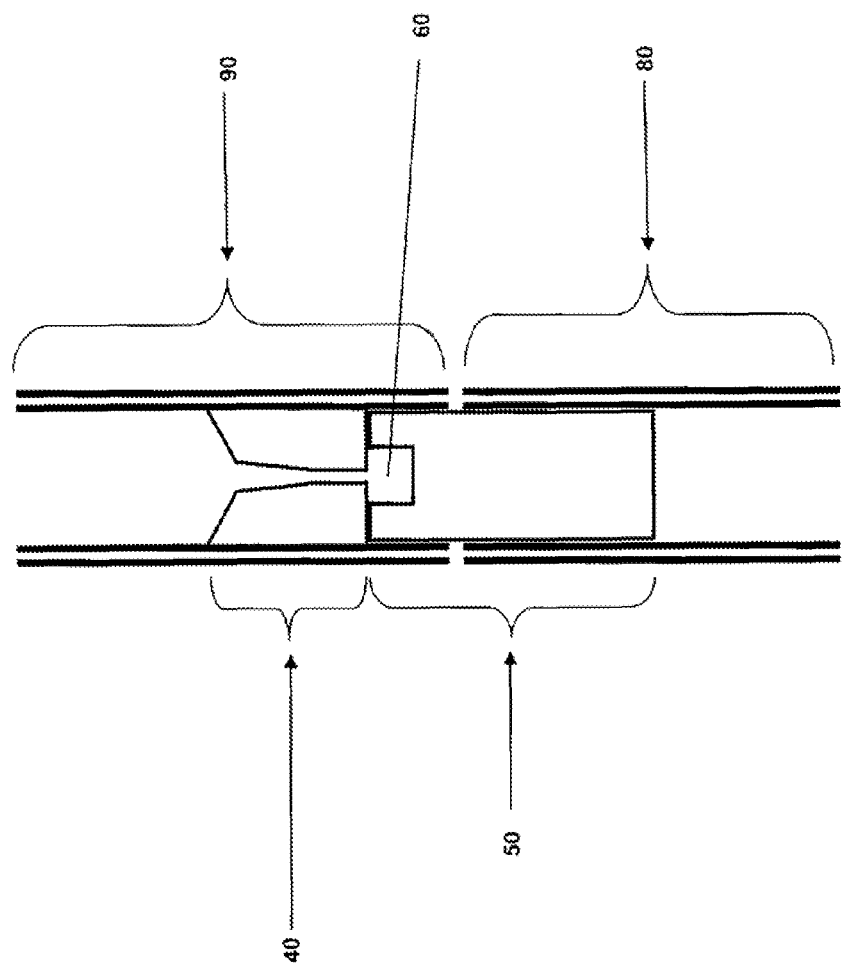

METHOD AND APPARATUS FOR GROWING POTASSIUM LEAD CHLORIDE CRYSTALS

CROSS-REFERENCE TO RELATED APPLICATION

This application claims priority to U.S. Provisional Patent Application Ser. No. 60/747,128, entitled "METHOD FOR BOTTOM-SEEDED GROWTH OF POTASSIUM LEAD CHLORIDE CRYSTALS FROM POLYCRYSTALLINE SEEDS," to Condon et al.

TECHNICAL FIELD

The present invention relates generally to a method and apparatus for growing potassium lead chloride crystals, and more particularly to method and apparatus for growing potassium lead chloride crystals from polycrystalline seeds.

BACKGROUND ART

There has been a great deal of research interest in recent years in laser sources that operate at mid-infrared wavelengths (i.e., longer than ~2.5 µm). Compact, rugged, and reliable laser sources in this region are valuable in a number of applications, including infrared countermeasures, free-space communications, and remote sensing. In the past, parametric conversion of visible and near-IR lasers offered the best route to producing mid-IR sources, but recently, rare-earth doped, diode-pumped solid-state lasers have begun to emerge as a viable option. For such a laser to function, its host material must have a low phonon energy to prevent rapid multiphonon quenching of mid-IR lasing energy levels. The low phonon materials with the most promise for use in mid-IR solid-state lasers are the family of ternary alkyl lead halides, in particular, potassium lead chloride, $KPb_2Cl_5$.

At room temperature, $KPb_2Cl_5$ is monoclinic (nearly orthorhombic), with lattice parameters a=0.8831 nm, b=0.7886 nm, c=1.243 nm, and β=90.14°. It has a low maximum phonon energy of 203 $cm^{-1}$, so it supports lasing out to at least 5 µm. It is hard enough to hold a polish (2.5 Mobs) and is only slightly hygroscopic, making it a good candidate for incorporation into practical laser systems. Single crystals of this material have been grown that incorporate trivalent rare-earth ions at concentrations up to ~3%, replacing $Pb^{2+}$ in one of its two distinct sites and creating a $K^+$ vacancy for charge compensation. Multiple spectroscopic studies have shown the anticipated low rates of nonradiative quenching for their long-wavelength transitions. Laser action has been demonstrated in $KPb_2Cl_5$ in the near-IR at 1.06 µm ($Nd^{3+}$) and 2.43 µm ($Dy^{3+}$) and in the mid-IR at 4.5 µm ($Er^{3+}$).

While there have been a large number of spectroscopic studies done on this material and many potential lasing transitions have been put forward, there have only been three laser demonstrations. This disparity between interest in the material and the number of successful lasers can be attributed directly to the difficulties involved in producing high-quality crystals. $KPb_2Cl_5$ will incorporate oxide impurities if it is melted under air, but melting it under vacuum causes it to decompose and leave behind metal impurities; this problem has been addressed successfully in the past through melting wider a chlorinating atmosphere. A more critical problem is the reproducible seeding of a Bridgman-Stockbarger growth. Even in an ampoule with a sharply-tapered tip, molten $KPb_2Cl_5$ has a strong tendency to supercool, sometimes remaining well below its freezing point for days at a time. This makes the formation of the tiny seed crystal needed for single-crystal growth an unreliable process. Additionally, the material's high degree of thermal expansion leads to the incorporation of a great deal of strain into the crystal as it cools, leading to cracking and reduced optical quality.

DISCLOSURE OF THE INVENTION

An embodiment of the invention includes a device including a plug comprising an axis. The plug includes a first portion defining a cylindrical hole about the axis. The plug includes a second portion defining a first conical hole about the axis, the first conical hole having a first angle. The plug includes a third portion defining a second conical hole about the axis, the second conical hole having a second angle opposite in sign relative to the first angle. The plug includes a fourth portion defining a third conical hole about the axis, the third conical hole having a third angle, the third angle having a same sign as the second angle and being greater than the second angle. The plug further includes an ampoule including the plug fused therein.

Optionally, the plug and/or the ampoule includes quartz.

Optionally, the second portion and the third portion meet at an aperture. Optionally, the aperture includes a diameter smaller than a cross-section of a single crystal of a polycrystalline material.

Another embodiment of the invention includes a method of growing a single crystal $Kb_2Cl_5$ material in a growth furnace comprising an upper zone set at 480° C. A single crystal $Kb_2Cl_5$ material is grown from a single $Kb_2Cl_5$ grain until a eutectic point is reached. The upper zone is cooled at 1°/hour to 380° C. The single crystal $Kb_2Cl_5$ material is annealed. The single crystal $Kb_2Cl_5$ material is cooled at 10°/hour to room temperature.

Optionally, the method further includes loading an ampoule with $Kb_2Cl_5$ powder, the ampoule including a plug, which includes a seeding well and an aperture. The $Kb_2Cl_5$ powder is melted, thereby generating a melt. The melt is frozen to capture a polycrystalline $Kb_2Cl_5$ material in the seeding well, thereby generating a polycrystalline $Kb_2Cl_5$ seed. The ampoule is loaded into the growth furnace. The polycrystalline $Kb_2Cl_5$ material is melted except for the polycrystalline $Kb_2Cl_5$ seed, the polycrystalline $Kb_2Cl_5$ seed including the single $Kb_2Cl_5$ grain. The polycrystalline $Kb_2Cl_5$ material is grown until the single $Kb_2Cl_5$ grain is isolated by the aperture.

Optionally, the plug includes a first portion defining a cylindrical hole about the axis. The plug includes a second portion defining a first conical hole about the axis, the first conical hole having a first angle. The plug includes a third portion defining a second conical hole about the axis, the second conical hole having a second angle opposite in sign relative to the first angle. The plug includes a fourth portion defining a third conical hole about the axis, the third conical hole having a third angle, the third angle having a same sign as the second angle and being greater than the second angle. Optionally, the second portion and the third portion meet at an aperture. Optionally, the aperture includes a diameter smaller than a cross-section of a single crystal of a polycrystalline material.

In an embodiment of the invention, careful materials preparation prevents the incorporation of oxide impurities into the crystal. In another embodiment of the invention, a novel ampoule design allows for greater seeding reproducibility without the use of a single-crystal seed. In another embodiment of the invention, an extended in situ annealing cycle relieves strain from the grown crystal, limiting cracking during cool-down and improving the crystal's optical quality.

Another embodiment of the invention includes a method of growing a single crystal $KPb_2Cl_5$ material in a growth furnace comprising an upper zone set at 480° C. A single crystal $KPb_2Cl_5$ material is grown from an oriented single crystal $KPb_2Cl_5$ seed until a eutectic point is reached. The upper zone is cooled at 1°/hour to 380° C. The single crystal $KPb_2Cl_5$ material is annealed. The single crystal $KPb_2Cl_5$ material is cooled at 10°/hour to room temperature.

Optionally, a device including an axis is provided. The device includes a conical plug including a first portion defining a first conical hole about the axis. The first conical hole has a first angle. The conical plug includes a second portion defining a second conical hole about the axis. The second conical hole has a second angle having the same sign as the first angle and being greater than the first angle. The conical plug includes a third portion defining a cylindrical hole. The device includes a first tube including the conical plug fused therein. The device includes a seeding well plug defining a cylindrical hole about the axis. The device includes a second tube including the seeding well plug fused therein. The second tube is operable to mate with the first tube such that the conical plug abuts the seeding well.

Optionally, the oriented single crystal $KPb_2Cl_5$ seed is placed in the seeding well. The first tube is fitted over the second tube. The first tube is filled at least pan-way with $KPb_2Cl_5$ powder. The first tube and the second tube are placed in an ampoule. The $KPb_2Cl_5$ powder is melted to generate a melt that wets the single crystal $KPb_2Cl_5$ seed. The melt is frozen.

Another embodiment of the invention includes a device including an axis. The device includes a conical plug including a first portion defining a first conical hole about the axis, the first conical hole having a first angle. The conical plug includes a second portion defining a second conical hole about the axis, the second conical hole having a second angle having the same sip as the first angle and being greater than the first angle. The conical plug includes a third portion defining a cylindrical hole. The device includes a first tube including the conical plug fused therein. The device includes a seeding well plug defining a cylindrical hole about the axis. The device includes a second tube includes a seeding well plug fused therein, the second tube being operable to mate with the first tube such that the conical plug abuts the seeding well.

Optionally, the device includes an ampoule with the first tube and the second tube emplaced therein.

Optionally, the conical plug, the seeding well plug, the first tube, the second tube, and/or the ampoule includes quartz.

BRIEF DESCRIPTION OF THE DRAWINGS

FIG. 3 is an enlarged portion of the cross-sectional view shown in FIG. 2.

BEST MODES OF CARRYING OUT THE INVENTION

An embodiment of the invention includes a method as follows. Potassium lead chloride is prepared from potassium chloride (e.g., Alfa Aesar, ultra-dry, 99.998%) and lead chloride (e.g., Alfa Aesar, ultra-dry 99.999%). The two regents are, for example, chlorinated sufficient to settle out impurities or convert material a wrong oxidation state metallic lead) to the correct oxidation state (e.g. $PbCl_2$). For example, the two reagents are loaded together into a quartz tube, where they are melted. It is understood that in this embodiment the $Cl_2$ pressure and the exposure time are inversely proportional. For example, the two reagents are melted between 300 and 400 torr of $Cl_2$ for approximately twenty-four hours of exposure. For example, they are melted under approximately 400 torr of $Cl_2$. However, and alternative pressure values and exposure times are acceptable. The melt is mixed by three cycles of melting and refreezing, then it is allowed to sit molten under chlorine, for example, for 24 hours before being slowly solidified from bottom to top. The ends of the resulting boule are then removed to dispose of any precipitated impurities. To purify the dopant, erbium (III) chloride, (e.g., Alfa Aesar, ultra-dry, 99.9%) is refined by melting under chlorine and directional solidification in a similar manner. Crushed, purified $ErCl_3$ and $KPb_2Cl_5$ are then mixed, melted, and refined under chlorine as above to produce $Er:KPb_2Cl_5$ with a dopant concentration between 0% (undoped) and 10% by atom. For example, the nominal dopant concentration is 3%.

Figure 1:
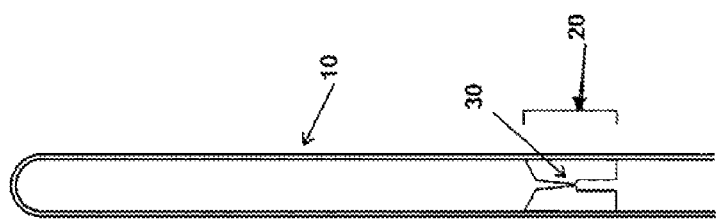
FIG. 1 is a cross-sectional view of an embodiment of the invention.

The crystal growth is performed in an ampoule 10, the top section of which is shown by way of example in FIG. 1. The ampoule 10 is a fused quartz tube. Dimensions of the tube are constrained by heat transport and any convection currents in the melt that destabilize the crystal growth process. Illustrative cross-sectional dimensions of the tube include 5 mm inner diameter ("ID") by 8 mm outer diameter ("OD"); 16 mm ID by 20 mm OD; and 10.5 mm ID by 13 mm OD. Alternative cross-sectional dimensions are acceptable. An illustrative length of the tube is 576 mm long, incorporating a machined quartz plug 20 about 8 cm from its end. Alternative lengths are acceptable. The lower part of the quartz plug is drilled cylindrically to about 8 mm depth, then a progressively tapered channel is drilled into the top. The two channels meet in an aperture 30 approximately 300 μm in diameter: this aperture is used to select a single crystal grain from the polycrystalline material during growth. The ampoule is loaded with doped $KPb_2Cl_5$ by inverting it, filling the open end with $KPb_2Cl_5$ powder, and then melting it under enough $Cl_2$ gas to prevent reduction of the $Pb^{2+}$ to metallic lead, but not so much that bubbles form in the melt as it solidifies. For example, the $KPb_2Cl_5$ powder is melted under between 25 and 125 torr (nominally 50 torr) of $Cl_2$. The $Cl_2$ pressure is then increased slowly to push most of the liquid through the aperture, leaving behind just enough to fill the cylindrical channel. The material is then frozen rapidly to produce a polycrystalline seed and the ampoule is righted. For example, the amount of time required for cooling is the time required for free cooling to room temperature. For example, the amount of time is less than five minutes. The ampoule is then filled with $Cl_2$ to a pressure sufficient to prevent decomposition while still avoiding bubble formation in the melt. For example, the ampoule is filled with 50 torr of $Cl_2$ and sealed for growth.

For safety reasons, all material processing is conducted inside a fume hood. This fact required some special adaptation of the crystal growth setup. To reduce vibrations, the ampoule growth assembly rides on a standard air-supported optical bench. Also the top of the growth furnace is sealed and the bottom has a 30 mm opening to admit the ampoule. This inverted furnace configuration configuration suppresses convective air currents and improves growth temperature stability. The ampoule is supported vertically from the bottom by a chuck attached to the shaft of a clock motor; rotation of the ampoule serves to mitigate uneven heating caused by azimuthal irregularities in the furnace. For example, the speed of the clock motor, at a lower bound, is at least sufficient to complete a rotation in less time than the thermal equilibrium time of the furnace/ampoule melt system. For example, the speed of the clock, at a upper bound, is not fast enough to induce currents in the melt. For example, the clock motor runs at 1 rpm.

Any two zone transparent furnace with a zone bounding at around the mid-point of the furnace, give or take 10%, is acceptable for use in an embodiment of the instant invention. An illustrative growth furnace is constructed of four Suprasil tubes of increasing size, the innermost of which is wound with coiled Nichrome-60 wire. The use of these transparent tubes as the body of the furnace allowed for direct, real-time observation of the growth as it proceeded. The furnace had two zones, each of which is controlled by as digital temperature controller, with the zone boundary at 150 mm from the bottom. The furnace itself is attached to a standard computer-controlled translator for position control. For example, a video camera with a digital video recorder monitors the growth process. The growth ampoule is placed in the furnace, which is set to provide a gradient at the melt line. The gradient is set such that if the gradient is too low, then convection in the melt makes the growth interface become unstable and irregular and such that if the gradient is too high, then the crystal cools to the point of strain when it reaches the lower zone. For example, the gradient ranges from 12 to 20° C./cm at the melt line. For example, the gradient is about 15° C./cm at the melt line. The material is then melted back into the cylindrical region of the quartz plug, leaving at least 1 mm of polycrystalline solid unmelted. Enough polycrystalline solid is left such that liquid does not leak around the solid. Growth then proceeds from this polycrystalline mass at a rate, with the aperture selecting a single crystal grain to seed the growth above the plug; the rate is bounded at the upper end by the stability of the growth interface. For example, the rate is less than 0.72 mm/hour. For example, the rate is around 0.36 mm/hour. As there is always solid present, this procedure prevented the melt from supercooling. Growth is allowed to proceed until enrichment of the melt by $Er^{3+}$, resulting from its partition coefficient in $KPb_2Cl_5$ of ~0.5, begins to measurably depress its freezing point.

Single crystal $KPb_2Cl_5$ is prone to cracking during cooling. Its high thermal expansion coefficient means that any temperature gradient results in stress. Further stress is induced by the differences between the crystal structures at growth temperature and at lower temperatures, including two solid-solid phase transitions that have been identified at temperatures of 175° C. and 267° C. This stress is responsible for breaking even isothermally-cooling crystals, with video records showing that the initial cracking usually occurs in the vicinity of 365° C., well above the phase transition temperatures, with the cracks propagating further as the cooldown continues. An extended in situ annealing at a temperature just above its breaking point is, for example, used to combat this cracking by allowing accumulated strain to relax. Thus, after growth is terminated, the furnace is slowly adjusted to provide an isothermal cool-down environment, then the crystal is cooled at 1° C./hour to 380° C., where it is then annealed for 96 hours. It is then brought rapidly through its phase transitions, cooling at a rate of 10° C./hour, to room temperature. Once at room temperature, the end of the ampoule is cut away and to harvest the crystal.

In an embodiment of the invention a method of manufacturing the plug 20 is described. A segment of cylindrical rod stock is cut. For example, the segment is 10 mm in diameter by 20 mm long. The rod stock is drilled using, for example, a centered 1.5 mm diameter square-ended diamond drill bit to drill out, for example, a first channel about 8 mm on the bottom of the rod stock. The rod stock is rotated 180° perpendicular to its cylindrical axis. The rod stock is then drilled using, for example, a first sharply-tapered conical diamond-coated drill bit to drill a second channel in the rod stock until the two channels meet in an aperture. For example, the aperture is greater than or equal to about 100 μm and less than or equal to about 400 μm. For example, the aperture is about 300 μm. A second conical diamond-coated drill bit having a broader taper than the first conical diamond-coated drill bit is used to drill the rod stock, thereby creating a taper to an end of the second channel. A fire polish is applied to an inside of the plug with an $H_2/O_2$ torch. The plug is then fused into an ampoule using an $H_2/O_2$ torch. The ampoule, for example, is round-tipped or pointed-tipped such that the tip holds structurally against a vacuum.

Figure 2:
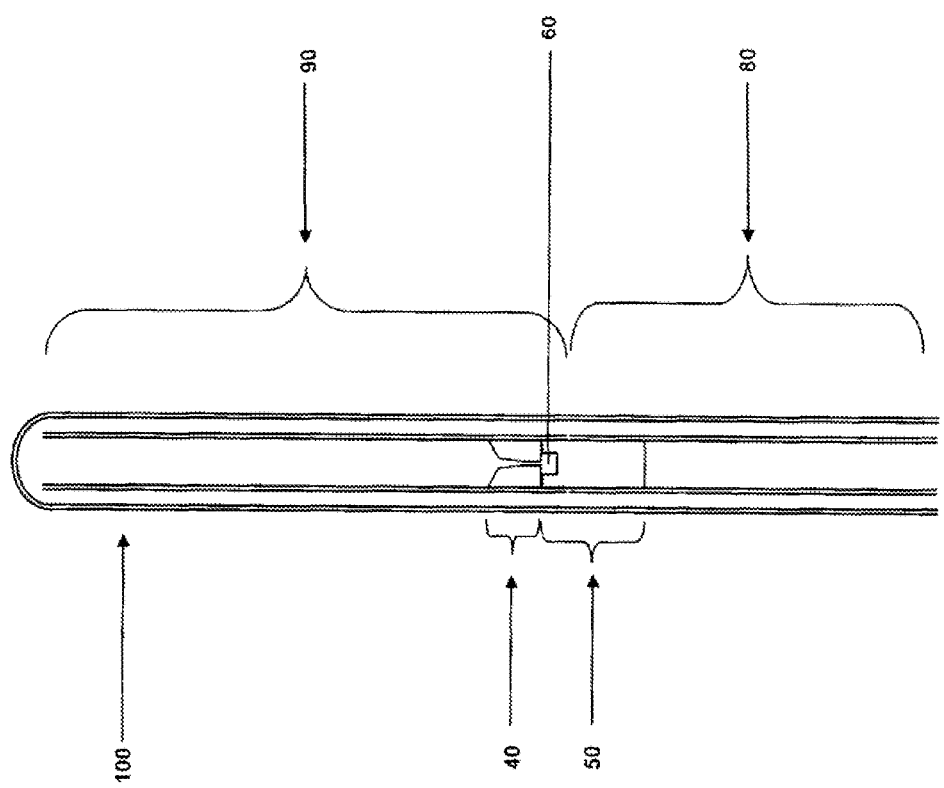
FIG. 2 is a cross-sectional view of another embodiment of the invention.

An alternative embodiment of the invention, for example, as shown in FIGS. 2 and 3, is described as follows. Growth of $KPb_2Cl_5$ is performed from an oriented seed, prepared ex situ, using methods similar to those used for growth from a polycrystalline seed generated in situ, described above. Two plugs 40, 50 are, for example, constructed that together resemble the plug used for the polycrystalline seeding, but cut transversely at the constriction. The upper, conical plug 40 is progressively tapered to a small (e.g., around 0.5 mm) orifice at the bottom. The lower, seeding well 50 plug contains a cylindrical seeding well 60 that is open on one end and closed on the other. For example, the seeding well 60 has a diameter no smaller than twice the diameter of the aperture in the upper conical plug 40 and no larger than the diameter of lower, seeding well plug 50. For example, the seeding well 60 is around 0.5 mm. Both plugs 40, 50 are fused into appropriate-diameter quartz tubes 80, 90 (which are, for example, open on both ends) such that the conical plug 40 is recessed in its tube 90 approximately 5 mm and the seeding well plug 50 is protruding from its tube 80 to the same extent. The top of the seeding well plug 50 and the bottom of the conical plug 40 are, for example, polished to fit together closely.

To load this embodiment of the invention, an oriented single crystal seed, polished to fit, is placed in the seeding well 60, for example, on a pad of clean quartz wool such that the seed protrudes from the well 60 by, for example, around 1 mm at rest, but will readily be pushed flush by the weight of the upper tube 90. The upper tube 90 is then fit over the lower tube 80 and is filled with crushed potassium lead chloride. The entire assembly is placed inside a larger quartz tube 100 with a round end on top and a PTFE plug fit in the bottom. The tube 100 is filled with ~50 torr of $Cl_2$ and is loaded into the furnace.

The growth procedure is similar to that used for the polycrystalline-seeded growth. When the potassium lead chloride is melted in the upper tube 90, it will run down through the orifice, wetting the single crystal seed. A thin sheet of liquid will move between the two plugs 40, 50 and down the outside of the seeding well plug 50 until it freezes around it and forms a seal. The melt line is brought carefully to just below the top of the seeding well 60, and oriented growth proceeds through the conical plug 40. Cooldown proceeds as with the polycrystalline-seeded growth described above.

Obviously, many modifications and variations of the present invention are possible in light of the above teachings without departing from the true scope and spirit of the invention. It is therefore to be understood that the scope of the invention should be determined by referring to the following appended claims.

What is claimed is:

1. A device comprising:

a plug comprising an axis, wherein said plug comprises a first portion defining a cylindrical hole about the axis, wherein said plug comprises a second portion contiguous with said first portion and defining a first conical hole about the axis, the first conical hole having a first angle, wherein said plug comprises a third portion contiguous with said second portion and defining a second conical hole about the axis, the second conical hole having a second angle opposite in sign relative to the first angle, wherein said plug comprises a fourth portion contiguous with said third portion and defining a third conical hole about the axis, the third conical hole having a third angle, the third angle having a same sign as the second angle and being greater than the second angle; and an ampoule comprising said plug fused therein.

2. The device according to claim 1, wherein at least one of said plug and said ampoule comprises quartz.

3. The device according to claim 1, wherein said second portion and said third portion meet at an aperture.

4. The device according to claim 3, wherein said aperture comprises a diameter smaller than a cross-section of a single seed of a polycrystalline material.

5. The device according to claim 1, wherein said cylindrical hole, said first conical hole, said second conical hole, and said third conical hole comprise a channel therethrough.

* * * * *